US 6,933,021 B2

(12) United States Patent
Chou et al.

(10) Patent No.: US 6,933,021 B2
(45) Date of Patent: Aug. 23, 2005

(54) METHOD OF TISIN DEPOSITION USING A CHEMICAL VAPOR DEPOSITION (CVD) PROCESS

(75) Inventors: Jing-Pei Chou, Sunnyvale, CA (US); Chien-Teh Kao, Sunnyvale, CA (US); Chiukin Lai, Sunnyvale, CA (US); Roderick C. Mosely, Pleasanton, CA (US); Mei Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 217 days.

(21) Appl. No.: 10/124,575

(22) Filed: Apr. 16, 2002

(65) Prior Publication Data

US 2002/0168468 A1 Nov. 14, 2002

Related U.S. Application Data

(63) Continuation-in-part of application No. 10/026,378, filed on Dec. 21, 2001, and a continuation-in-part of application No. 08/808,246, filed on Feb. 28, 1997, and a continuation-in-part of application No. 08/680,913, filed on Jul. 12, 1996, now abandoned, and a continuation-in-part of application No. 08/677,185, filed on Jul. 9, 1996, now Pat. No. 6,155,198, and a continuation-in-part of application No. 08/677,218, filed on Jul. 9, 1996, now abandoned, and a continuation-in-part of application No. 08/567,461, filed on Dec. 5, 1995, now abandoned, and a continuation-in-part of application No. 08/498,990, filed on Jul. 6, 1995, now abandoned.

(51) Int. Cl.$^7$ .............................. B05D 3/04; B05D 3/06; H05H 1/24; C23C 16/02; C23C 16/34; C23C 16/42

(52) U.S. Cl. ........... 427/535; 427/255.27; 427/255.391; 427/255.394; 438/785; 438/786

(58) Field of Search ................................ 427/535, 534, 427/563, 574, 564, 576, 578, 579, 255.27, 255.391, 255.393, 255.394; 438/783, 785, 786, 792

(56) References Cited

U.S. PATENT DOCUMENTS 5,175,126 A * 12/1992 Ho et al.
5,567,483 A * 10/1996 Foster et al. ................ 427/535
5,576,071 A * 11/1996 Sandhu ....................... 427/535

(Continued)

FOREIGN PATENT DOCUMENTS

GB          2299345 A   * 10/1996
WO       WO 00/16377     * 3/2000

OTHER PUBLICATIONS

Sivaram, *Chem. Vap. Dep.: Thermal & Plasma Dep. of Electronic Mat.*

U.S. Appl. No. 60/028,798, Lu, filed Oct. 31, 1996.*

U.S. Appl. No. 60/010,405, Lu, filed Jan. 22, 1996.*

*Primary Examiner*—Marianne Padgett
(74) *Attorney, Agent, or Firm*—Moser, Patterson & Sheridan, LLP

(57) ABSTRACT

A method of forming a titanium silicide nitride (TiSiN) layer on a substrate id described. The titanium silicide nitride (TiSiN) layer is formed by providing a substrate to a process chamber and treating the substrate with a silicon-containing gas. A titanium nitride layer is formed on the treated substrate and exposed to a silicon-containing gas. The titanium nitride (TiN) layer reacts with the silicon-containing gas to form the titanium silicide nitride (TiSiN) layer. The formation of the titanium silicide nitride (TiSiN) layer is compatible with integrated circuit fabrication processes. In one integrated circuit fabrication process, the titanium silicide nitride (TiSiN) layer may be used as a diffusion barrier for a tungsten (W) metallization process.

40 Claims, 12 Drawing Sheets

U.S. PATENT DOCUMENTS

| | | | |
|---|---|---|---|
| 5,770,520 A | 6/1998 | Zhao et al. | 438/653 |
| 5,989,999 A * | 11/1999 | Levine et al. | 438/627 |
| 6,001,660 A | 12/1999 | Park et al. | 438/3 |
| 6,017,818 A * | 1/2000 | Lu | 438/653 |
| 6,124,638 A | 9/2000 | Iwasa | 257/751 |
| 6,271,136 B1 * | 8/2001 | Shue et al. | 438/687 |
| 6,436,820 B1 * | 8/2002 | Hu et al. | 438/656 |
| 6,562,715 B1 * | 5/2003 | Chen et al. | 438/643 |
| 6,596,643 B2 * | 7/2003 | Chen et al. | 438/706 |
| 6,720,027 B2 * | 4/2004 | Yang et al. | 427/123 |
| 6,793,969 B2 * | 9/2004 | Shimogaki et al. | 427/255.36 |
| 6,794,284 B2 * | 9/2004 | Vaartstra | 438/627 |
| 6,803,309 B2 * | 10/2004 | Chou et al. | 438/653 |
| 2004/0077183 A1 * | 4/2004 | Chung | 438/785 |
| 2004/0197492 A1 * | 10/2004 | Chen et al. | 427/569 |

* cited by examiner

METHOD OF TISIN DEPOSITION USING A CHEMICAL VAPOR DEPOSITION (CVD) PROCESS

CROSS-REFERENCE TO RELATED APPLICATIONS

This application is a continuation-in-part of co-pending U.S. patent application Ser. No. 10/026,378, entitled "METHOD OF TISIN DEPOSITION USING A CHEMICAL VAPOR DEPOSITION (CVD) PROCESS" and filed on Dec. 21, 2001; co-pending U.S. patent application Ser. No. 08/808,246, entitled "METHOD FOR CONSTRUCTING A FILM ON A SEMICONDUCTOR WAFER" and filed on Feb. 28, 1997; U.S. patent application Ser. No. 08/498,990, entitled "BIASED PLASMA ANNEALING OF THIN FILMS" and filed on Jul. 6, 1995 now abandoned; U.S. patent application Ser. No. 08/567,461, entitled "PLASMA ANNEALING OF THIN FILMS" and filed on Dec. 5, 1995 now abandoned; U.S. patent application Ser. No. 08/677,185, entitled "CHAMBER FOR CONSTRUCTING AN OXIDIZED FILM ON A SEMICONDUCTOR WAFER" and filed on Jul. 9, 1996 now U.S. Pat No. 6,155,198 ; U.S. patent application Ser. No. 08/677,218, entitled "IN-SITU CONSTRUCTION OF AN OXIDIZED FILM ON A SEMICONDUCTOR WAFER", and filed on Jul. 9, 1996 now abandoned; and U.S. patent application Ser. No. 08/680,913, entitled "PLASMA BOMBARDING OF THIN FILMS" and filed on Jul. 12, 1996 now abandoned. Each of the aforementioned related patent applications is herein incorporated by reference.

BACKGROUND OF THE INVENTION

1. Field of the Invention

The present invention generally relates to titanium silicide nitride (TiSiN) layers and, more particularly, to a method of forming titanium silicide nitride (TiSiN) layers.

2. Description of the Related Art

In the manufacture of integrated circuits, intermediate or transition layers are often used as metal barrier layers to inhibit the diffusion of metals into an underlying region beneath the barrier layer and/or to enhance adhesion of subsequently formed layers. These underlying regions include transistor gates, capacitor dielectric, semiconductor substrates, metal lines, and many other structures that appear in integrated circuits.

For example, when a transistor gate electrode is formed, a diffusion barrier is typically formed between the gate material (e.g., polysilicon (Si)) and the metal (e.g., tungsten (W), copper (Cu), aluminum (Al)) comprising the electrode. The diffusion barrier inhibits metal diffusion into the gate material. Such metal diffusion is undesirable because it would change the characteristics of the transistor, or render it inoperative. A combination of titanium/titanium silicide nitride (Ti/TiSiN), for example, is often used as the diffusion barrier.

Such diffusion barrier material may also be used in a tungsten metallization process to provide contacts to source and drain regions of a transistor. For example, in a tungsten (W) plug process, a titanium (Ti) layer is deposited on a silicon (Si) substrate. A titanium silicide nitride (TiSiN) layer is then formed upon the titanium (Ti) layer, prior to forming the tungsten (W) plug. In addition to being a barrier material, the titanium silicide nitride (TiSiN) serves two additional functions: 1) prevents chemical attack of the titanium (Ti) by tungsten hexafluoride ($WF_6$) during tungsten (W) deposition; and 2) acts as a glue layer to promote adhesion of the tungsten (W) plug.

The titanium silicide nitride (TiSiN) layer may be formed using a chemical vapor deposition (CVD) process. For example, titanium tetrachloride ($TiCl_4$), ammonia ($NH_3$) and silane ($SiH_4$) may be thermally reacted to form titanium silicide nitride (TiSiN). Alternatively, titanium tetrachloride ($TiCl_4$) and ammonia ($NH_3$) may be thermally reacted to form a titanium nitride (TiN) layer, into which silicon (Si) is subsequently incorporated by treating such layer using a silicon-containing gas (e.g., silane ($SiH_4$)).

However, when a $TiCl_4$-based chemistry is used to form the titanium silicide nitride (TiSiN) layer, reliability problems are encountered. In particular, by-products generated during the titanium nitride (TiN) layer formation may react with the silicon-containing gas, inhibiting the incorporation of silicon (Si) therein, and adversely affecting the adhesion/barrier properties as well as the resistivity of the titanium silicide nitride (TiSiN) layer.

Therefore, there is a need in the art for a method of forming titanium silicide nitride (TiSiN) layers having improved film characteristics.

SUMMARY OF THE INVENTION

The present invention relates to a method of forming a titanium silicide nitride (TiSiN) layer on a substrate. The titanium silicide nitride (TiSiN) layer is formed by providing a substrate to a process chamber. A titanium nitride layer is formed on the treated substrate and exposed to a silicon-containing gas. The titanium nitride (TiN) layer reacts with the silicon-containing gas to form the titanium silicide nitride (TiSiN) layer. The substrate may optionally be treated with a silicon-containing gas prior to titanium nitride layer deposition.

The formation of the titanium silicide nitride (TiSiN) layer is compatible with integrated circuit fabrication processes. In one integrated circuit fabrication process, the titanium silicide nitride (TiSiN) layer may be used as a diffusion barrier for a tungsten (W) metallization process. For such an embodiment, a preferred process sequence includes optionally treating a silicon substrate having apertures defined in a dielectric material layer formed thereon with a silicon-containing gas. A titanium nitride (TiN) layer is deposited in the apertures and in contact with the silicon substrate. The titanium nitride (TiN) layer is exposed to a silicon-containing gas. The titanium nitride (TiN) layer reacts with the silicon-containing gas to form a titanium silicide nitride (TiSiN) layer. Thereafter, the tungsten metallization process is completed when the apertures are filled with tungsten (W).

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Wafer Processing System

Figure 1:
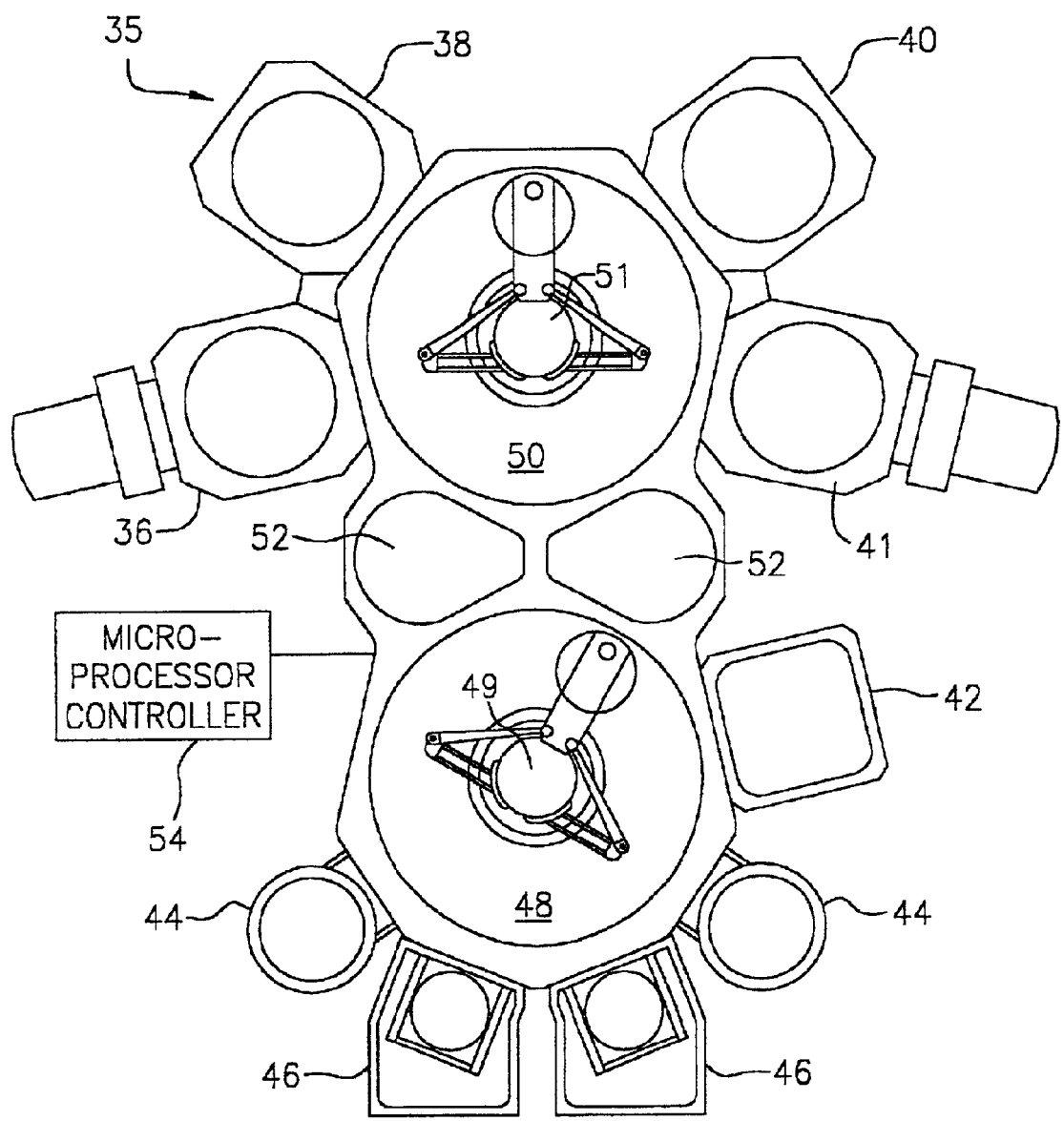
FIG. 1 depicts a schematic illustration of an apparatus that can be used for the practice of embodiments described herein.

FIG. 1 is a schematic representation of a wafer processing system 35 that can be used to perform integrated circuit fabrication in accordance with embodiments described herein. The wafer processing system 35 typically comprises process chambers 36, 38, 40, 41, degas chambers 44, load-lock chambers 46, transfer chambers 48, 50, pass-through chambers 52, a microprocessor controller 54, along with other hardware components such as power supplies (not shown) and vacuum pumps (not shown). An example of such a wafer processing system 35 is an ENDURA® System, commercially available from Applied Materials, Inc., Santa Clara, Calif.

Details of the wafer processing system 35 are described in commonly assigned U.S. Pat. No. 5,186,718, entitled "STAGED-VACUUM SUBSTRATE PROCESSING SYSTEM AND METHOD", issued Feb. 16, 1993, and is hereby incorporated by reference. The salient features of the wafer processing system 35 are briefly described below.

The wafer processing system 35 includes two transfer chambers 48, 50, each containing a transfer robot 49, 51. The transfer chambers 48, 50 are separated one from the other by pass-through chambers 52.

Transfer chamber 48 is coupled to load-lock chambers 46, degas chambers 44, pre-clean chamber 42 and pass-through chambers 52. Substrates (not shown) are loaded into wafer processing system 35 through load-lock chambers 46. Thereafter, the substrates are sequentially degassed and cleaned in degas chambers 44 and the pre-clean chamber 42, respectively. The transfer robot 48 moves the substrates between the degas chambers 44 and the pre-clean chamber 42.

Transfer chamber 50 is coupled to a cluster of process chambers 36, 38, 40, 41. The cleaned substrates (not shown) are moved from transfer chamber 48 into transfer chamber 50 via pass-through chambers 52. Thereafter, transfer robot 51 moves the substrates between one or more of the process chambers 36, 38, 40, 41.

The process chambers 36, 38, 40, 41 are used to perform various integrated circuit fabrication sequences. For example, process chambers 36, 38, 40, 41 may include chemical vapor deposition (CVD) chambers, physical vapor deposition (PVD) chambers, ionized metal plasma physical vapor deposition (IMP PVD) chambers, rapid thermal process (RTP) chambers and plasma etch (PE) chambers, among others.

Chemical Vapor Deposition (CVD) Process Chamber

Figure 2:
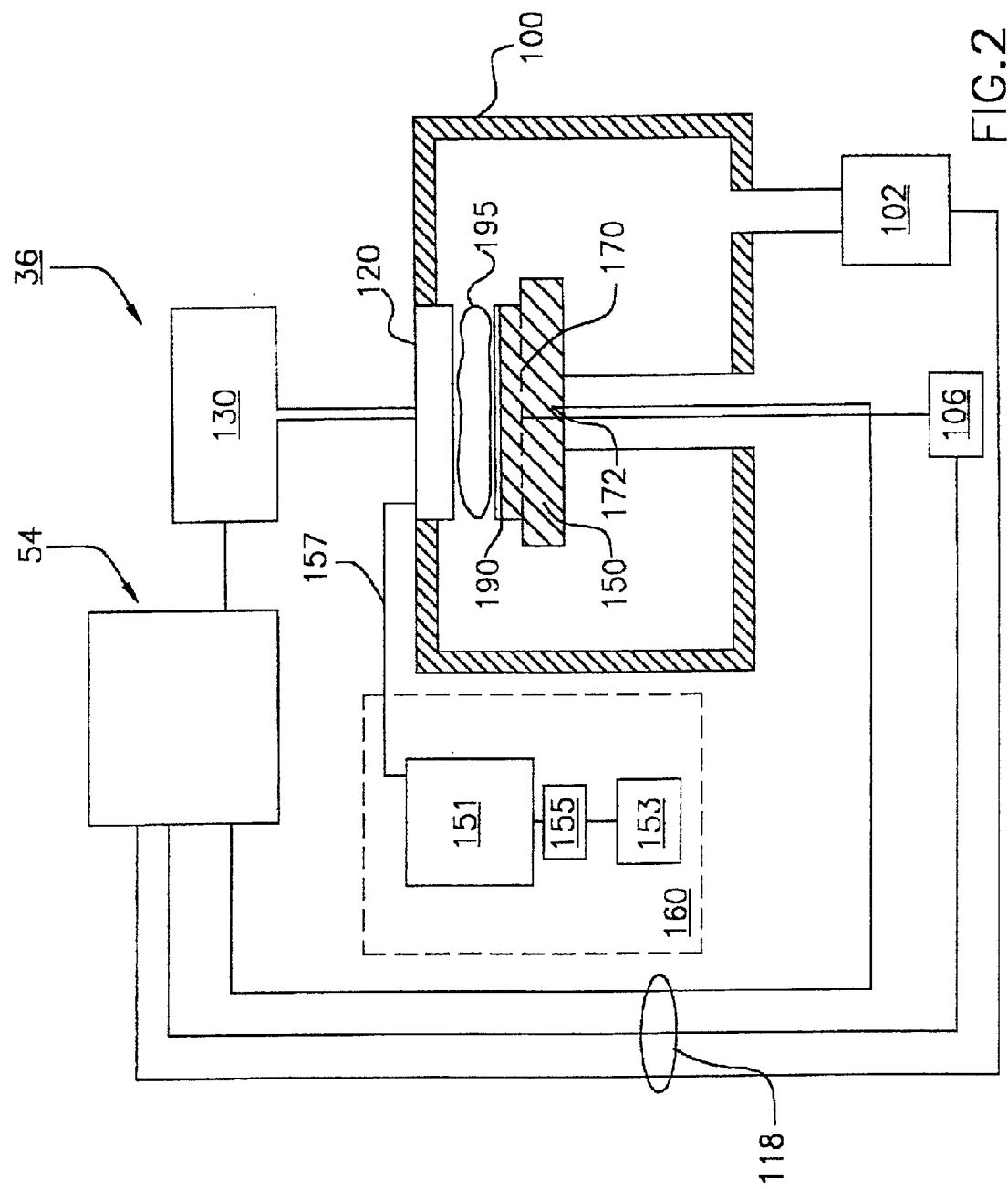
FIG. 2 depicts a schematic cross-sectional view of a chemical vapor deposition (CVD) chamber.

FIG. 2 depicts a schematic cross-sectional view of a chemical vapor deposition (CVD) process chamber 36 of wafer processing system 35. CVD process chamber 36 may be used to deposit titanium suicide nitride (TiSiN) barrier layers on semiconductor wafers. An example of such a CVD process chamber 36 includes TxZ® chambers, commercially available from Applied Materials, Inc., Santa Clara, Calif.

The CVD process chamber 36 generally houses a wafer support pedestal 150, which is used to support a substrate 190. The wafer support pedestal 150 can typically be moved in a vertical direction inside the CVD process chamber 36 using a displacement mechanism (not shown).

Depending on the specific CVD process, the substrate 190 can be heated to some desired temperature prior to or during deposition. For example, the wafer support pedestal 150 may be heated by an embedded heater element 170. The wafer support pedestal 150 may be resistively heated by applying an electric current from an AC power supply 106 to the heater element 170. The substrate 190 is, in turn, heated by the pedestal 150.

A temperature sensor 172, such as a thermocouple, is also embedded in the wafer support pedestal 150 to monitor the temperature of the pedestal 150 in a conventional manner. The measured temperature is used in a feedback loop to control the AC power supply 106 for the heating element 170, such that the substrate temperature can be maintained or controlled at a desired temperature which is suitable for the particular process application.

A vacuum pump 102 is used to evacuate the CVD process chamber 36 and to maintain the proper gas flows and pressure inside such chamber 36. A showerhead 120, through which process gases are introduced into the process chamber 36, is located above the wafer support pedestal 150. The showerhead 120 is connected to a gas panel 130, that controls and supplies various gases provided to the process chamber 36.

Proper control and regulation of the gas flows through the gas panel 130 is performed by mass flow controllers (not shown) and a microprocessor controller 54 (FIG. 1). A showerhead 120 allows process gases from the gas panel 130 to be uniformly introduced and distributed in the CVD process chamber 36.

The CVD process chamber 36 may comprise additional components for enhancing layer deposition on the substrate 190. For example, the showerhead 120 and the wafer support pedestal 150 may also form a pair of spaced apart electrodes. When an electric field is generated between these electrodes, the process gases introduced into the chamber 36 are ignited into a plasma.

Typically, the electric field is generated by coupling the wafer support pedestal 150 to a source of radio frequency (RF) power (not shown) through a matching network (not shown). Alternatively, the RF power source and matching network may be coupled to the showerhead 120, or coupled to both the showerhead 120 and the wafer support pedestal 150.

Plasma enhanced chemical vapor deposition (PECVD) techniques promote excitation and/or disassociation of the reactant gases by the application of the electric field to the reaction zone near the substrate surface, creating a plasma of reactive species. The reactivity of the species in the plasma reduces the energy required for a chemical reaction to take place, in effect lowering the required temperature for such PECVD processes.

Optionally, a remote plasma source 160 may be coupled to the CVD process chamber 36, to provide a remotely generated plasma to the process chamber 36. The remote plasma source 160 includes a gas supply 153, a gas flow controller 155, a plasma chamber 151, and a chamber inlet 157. The gas flow controller 155 controls the flow of process gas from the gas supply 153 to the plasma chamber 151.

A remote plasma may be generated by applying an electric field to the process gas in the plasma chamber 151, creating a plasma of reactive species. Typically, the electric field is generated in the plasma chamber 151 using an RF source (not shown). The reactive species generated in the remote plasma source 160 are introduced into the process chamber 36 through inlet 157.

The CVD process chamber 36 is controlled by a microprocessor controller 54. The microprocessor controller 54 may be one of any form of general purpose computer processor (CPU) that can be used in an industrial setting for controlling various chambers and sub-processors. The computer processor may use any suitable memory, such as random access memory, read only memory, floppy disk drive, hard disk, or any other form of digital storage, local or remote. Various support circuits may be coupled to the CPU for supporting the processor in a conventional manner. Software routines as required may be stored in the memory or executed by a second CPU that is remotely located.

The software routines are executed after the substrate is positioned on the pedestal. The software routines, when executed, transform the general purpose computer into a specific process computer that controls the chamber operation so that a chamber process is performed. Alternatively, the software routines may be performed in hardware, as an application specific integrated circuit or other type of hardware implementation, or a combination of software and hardware.

Titanium Silicide Nitride Layer Formation

Figure 3:
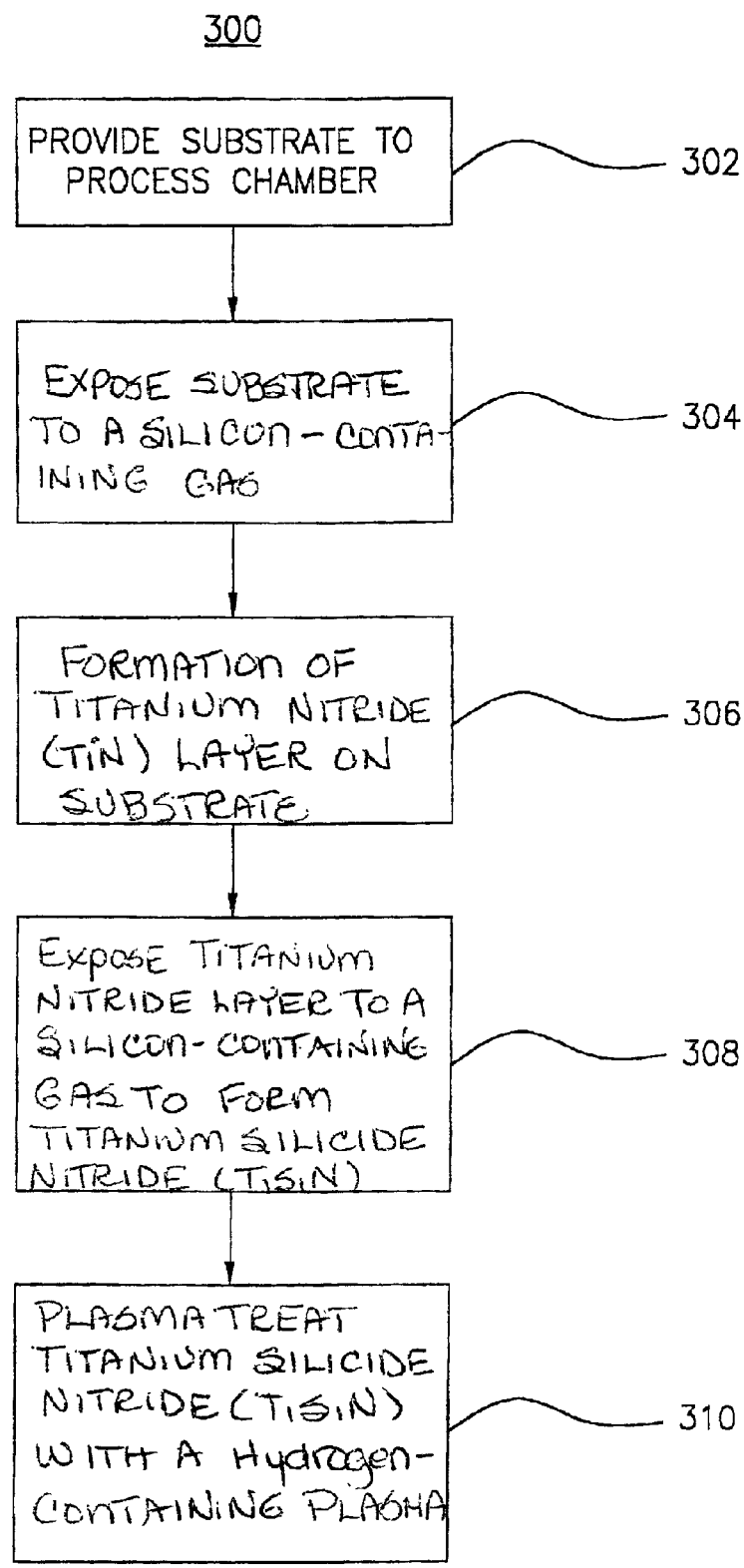
FIG. 3 illustrates a process sequence incorporating titanium silicide nitride (TiSiN) formation steps according to one embodiment described herein.

FIG. 3 illustrates a process sequence 300 detailing the various steps used for the formation of a titanium silicide nitride (TiSiN) layer. These steps may be performed in a CVD process chamber similar to that described above with reference to FIG. 2. As shown in step 302, a substrate is provided to the CVD process chamber. The substrate may be, for example, a silicon substrate, which may or may not have one or more material layers disposed thereon. Such one or more material layers, for example, may include an oxide layer having a contact hole therein that exposes the surface of the silicon substrate.

In step 304, the substrate is optionally treated with a silicon-containing gas. The silicon-containing gas may be, for example, silane ($SiH_4$) or disilane ($Si_2H_6$), among others. The silicon-containing gas may be mixed with one or more carrier gases selected from the group consisting of hydrogen ($H_2$), nitrogen ($N_2$), argon (Ar) and helium (He), among others. Treating the substrate with the silicon-containing gas prior to titanium nitride layer deposition is believed to improve the adhesion of the titanium nitride layer on the substrate.

The silicon-containing gas may be introduced into the CVD process chamber to treat the substrate as the temperature therein is increased to the titanium nitride (TiN) deposition temperature. Optionally, the silicon-containing gas may be introduced into the CVD process chamber after the titanium nitride (TiN) deposition temperature is reached.

Typically, the treatment with the silicon-containing gas can be performed with a silicon-containing gas flow rate of about 5 sccm (standard cubic centimeters per minute) to about 80 sccm, a pressure of about 5 torr to about 8 torr and a temperature up to about 380° C. When the silicon-containing gas is mixed with a carrier gas, the ratio of the silicon-containing gas to the carrier gas is preferably greater than 1.

In step 306, a titanium nitride (TiN) layer is deposited on the treated substrate and in contact with the silicon surface. The titanium nitride (TiN) layer may be formed, for example, from a reaction of titanium tetrachloride ($TiCl_4$) and ammonia ($NH_3$). In one embodiment, titanium tetrachloride ($TiCl_4$), helium (He) and nitrogen ($N_2$) are introduced into the CVD process chamber via a first pathway (gas line) of the showerhead 120. Ammonia ($NH_3$), along with nitrogen ($N_2$), is introduced into the process chamber via a second pathway of the showerhead. Helium (He) and argon (Ar), or other inert gases, may also be used, either singly or in combination (i.e., as a gas mixture) within either gas line of the showerhead 120.

Typically, the reaction can be performed at a titanium tetrachloride ($TiCl_4$) flow rate of about 50 mg/min (milligrams/minute) to about 350 mg/min introduced into the process chamber through the first pathway of the showerhead and an ammonia ($NH_3$) flow rate of about 100 sccm to about 500 sccm introduced into the process chamber through the second pathway of the showerhead. A pressure of about 5 torr to about 30 torr and a pedestal temperature between about 400° C. to about 700° C. may be used. The above deposition parameters provide a deposition rate for titanium nitride (TiN) of about 5 Å/sec (Angstroms/second) to about 13 Å/sec.

More preferably the titanium nitride (TiN) layer is deposited at a titanium tetrachloride ($TiCl_4$) flow rate of about 170 mg/min in about 1000 sccm of helium (He) and about 1000 sccm of nitrogen ($N_2$), along with an ammonia ($NH_3$) flow rate of about 100 sccm in about 2000 sccm of nitrogen ($N_2$), at a pressure of about 10 torr and a temperature of about 680° C. Under these process conditions, the titanium nitride (TiN) layer exhibits a step coverage of at least 95% for an aspect ratio of about (8:1). The aspect ratio is defined as the ratio of the depth of a feature to the width of the feature.

Referring to step 308, the titanium nitride (TiN) layer is exposed to a silicon-containing gas for silicon (Si) incorporation, converting the titanium nitride (TiN) layer into a titanium silicide nitride (TiSiN) layer. The silicon-containing gas may be, for example, silane ($SiH_4$) or disilane ($Si_2H_6$), among others. The silicon-containing gas may be mixed with one or more carrier gases selected from the group consisting of hydrogen ($H_2$), nitrogen ($N_2$), argon (Ar) and helium (He), among others.

Typically, the silicide formation step can be performed with a silicon-containing gas flow rate of about 200 sccm to about 3000 sccm, a pressure of about 0.5 torr to about 20 torr and a temperature of about 500° C. to about 700° C. When the silicon-containing gas is mixed with a carrier gas, the ratio of the silicon-containing gas to the carrier gas is preferably greater than 1. More preferably the silicide formation step is performed with a silane ($SiH_4$) flow rate of about 80 sccm, a hydrogen ($H_2$) flow rate of about 450 sccm, a pressure of about 5 torr and a temperature of about 650° C.

In step 310, after the silicide formation step, the titanium silicide nitride (TiSiN) layer is plasma treated to remove impurities therefrom. The titanium silicide nitride (TiSiN) layer is plasma treated using a hydrogen-containing plasma. The hydrogen-containing plasma may be generated from a gas mixture comprising one or more gases selected from the group consisting of hydrogen ($H_2$), ammonia ($NH_3$) and hydrazine ($N_2H_4$), among others. Dilutant gases such as nitrogen ($N_2$), argon (Ar) and helium (He), among others may also be added to the gas mixture.

Typically, the titanium silicide nitride (TiSiN) layer is plasma treated at a substrate temperature of about 400° C. to about 700° C., a chamber pressure of about 5 torr to about 30 torr, a hydrogen-containing gas flow rate of about 100 sccm to about 1000 sccm, a radio frequency (RF) power of about 0.5 W/cm$^2$ (Watts/square centimeter) to about 10 W/cm$^2$, and a plate spacing of about 300 mils to about 500 mils. The titanium silicide nitride (TiSiN) layer is plasma treated for about 5 seconds to about 1000 seconds, depending on the layer thickness. When the hydrogen-containing plasma also includes nitrogen a nitrogen/hydrogen gas flow ratio of about 0.1 to about 1 is preferred.

Other process chambers are within the scope of the invention, and the parameters listed above may vary according to the particular process chamber used to form the titanium silicide nitride (TiSiN) layer. For example, other process chambers may have a larger (e.g., configured to accommodate 300 millimeter substrates) or smaller volume, requiring gas flow rates that are larger or smaller than those recited for process chambers available from Applied Materials, Inc., Santa Clara, Calif.

Figure 4A:
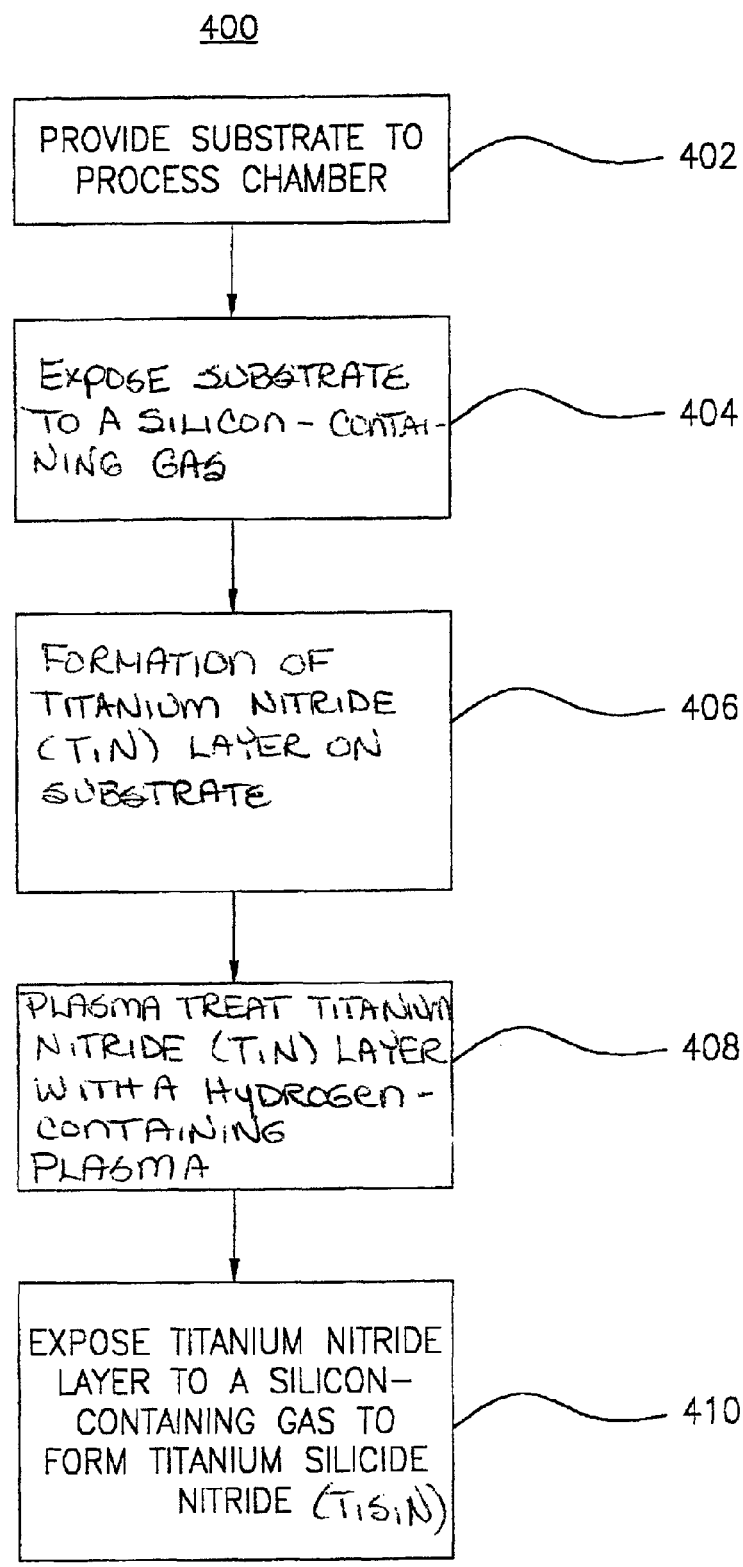
FIGS. 4A–4B illustrate process sequences incorporating titanium silicide nitride (TiSiN) formation steps according to alternate embodiments described herein.

In the fabrication sequence described with respect to FIG. 3, the silicon-containing gas exposure step 308 is performed after titanium nitride (TiN) layer deposition (step 306) and prior to the plasma treatment with the hydrogen-containing plasma (step 310). Alternatively, referring to FIG. 4A, the silicon-containing gas exposure may be performed after the plasma treatment with the hydrogen-containing gas. For such an embodiment, a titanium silicide nitride (TiSiN) layer fabrication sequence 400 includes providing a substrate to the process chamber (step 402), exposing the substrate to a silicon-containing gas (step 404), forming a titanium nitride (TiN) layer on the substrate (step 406), plasma treating the titanium nitride (TiN) layer with a hydrogen-containing plasma (step 408) and exposing the plasma treated titanium nitride (TiN) layer to a silicon-containing gas to form a titanium silicide nitride (TiSiN) layer (step 410).

Figure 4B:
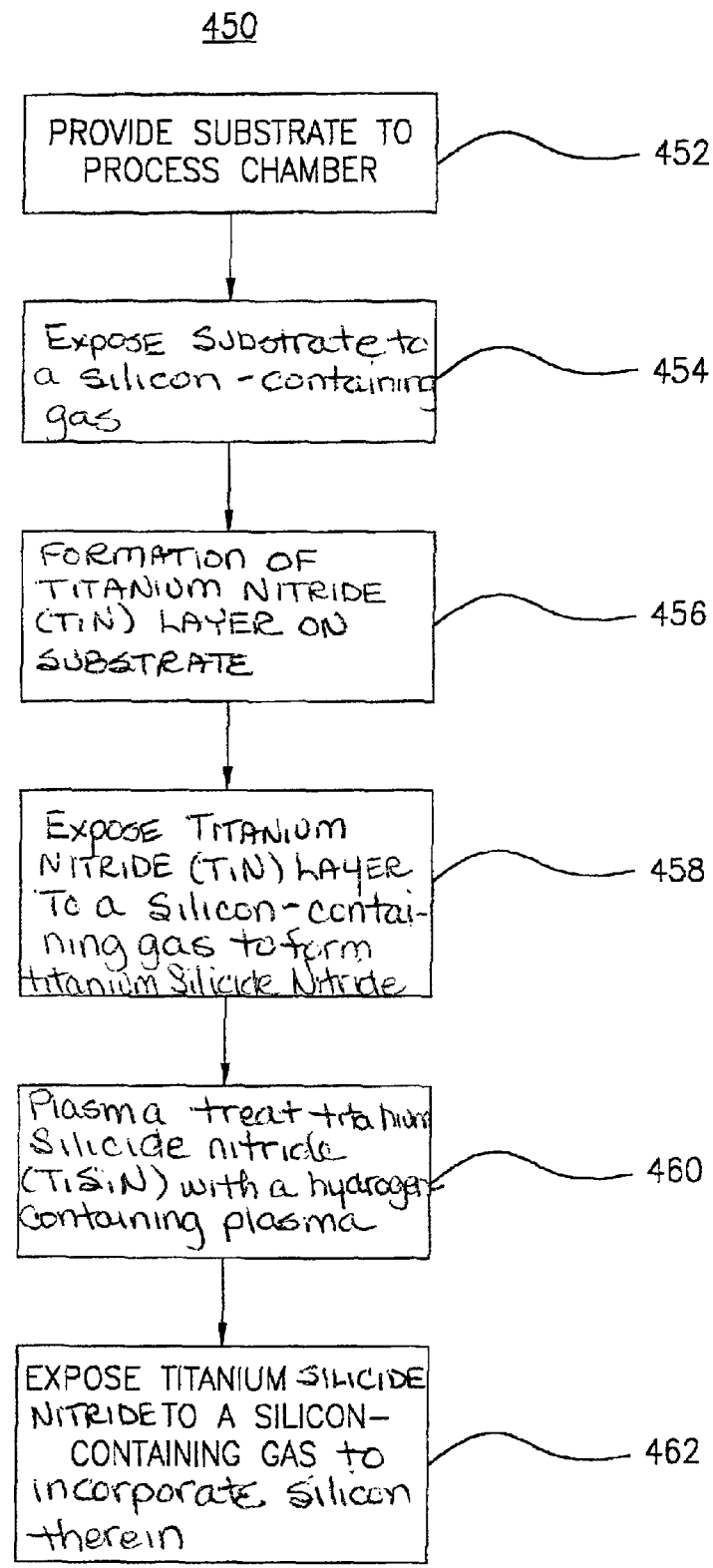

In another embodiment, more than one silicon-containing gas exposure step may be performed. Referring to FIG. 4B, a first silicon-containing gas exposure step may be performed after the titanium nitride (TiN) layer deposition and a second silicon-containing gas exposure step may be performed after the plasma treatment step with the hydrogen-containing plasma. For such an embodiment, a titanium silicide nitride (TiSiN) layer fabrication sequence 450 includes providing a substrate to the process chamber (step 452), exposing the substrate to a silicon-containing gas (step 454), forming a titanium nitride (TiN) layer on the substrate (step 456), exposing the titanium nitride (TiN) layer to a silicon-containing gas to form a titanium silicide nitride (TiSiN) layer (step 458), plasma treating the titanium silicide nitride (TiSiN) layer with a hydrogen-containing plasma (step 460) and exposing the plasma treated titanium silicide nitride (TiSiN) layer to a silicon-containing gas to incorporate silicon therein (step 462).

Additionally, during the titanium silicide nitride (TiSiN) layer formation, one or more process chamber purge steps may be performed prior to exposure of the silicon-containing gas. The process chamber is purged to remove any reaction by-products generated during titanium nitride (TiN) layer formation or during the plasma treatment step with the hydrogen-containing plasma. These undesirable reaction by-products may interfere with the adhesive properties of films subsequently deposited on the titanium silicide nitride (TiSiN) layer, such as, for example, a tungsten (W) layer. The process chamber is purged by providing a purge gas to the process chamber and then evacuating both the purge gas as well as the reaction by-products therefrom.

The purge gas may be one or more gases selected from the group of nitrogen (N$_2$), hydrogen (H$_2$), helium (He), argon (Ar), neon (Ne) and xenon (Xe), among others. Typically, the process chamber is purged by providing thereto a purge gas at a flow rate of about 100 sccm to about 1000 sccm, for up to about 5 minutes.

Figure 5A:
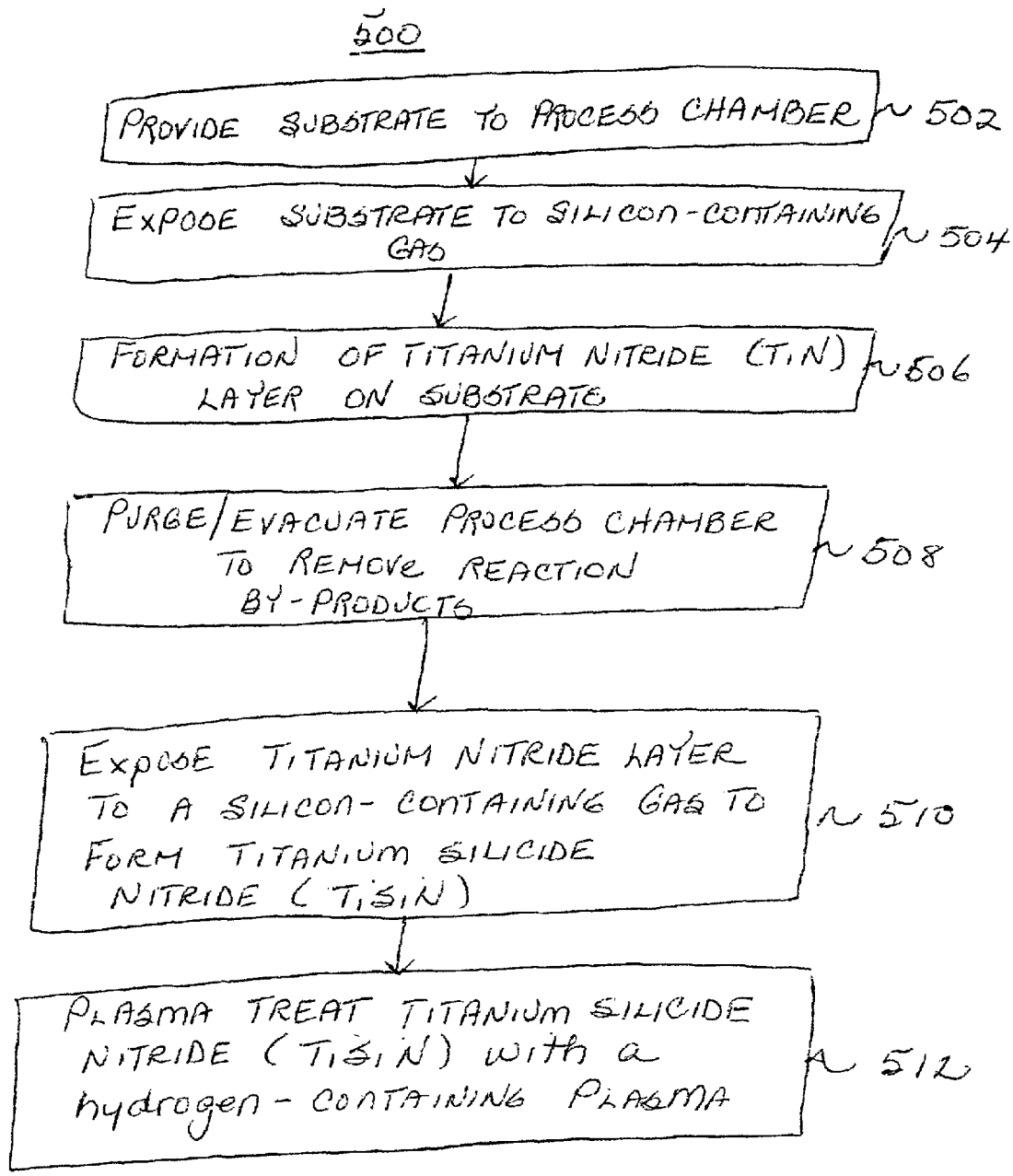
FIGS. 5A–5C illustrate process sequences incorporating titanium silicide nitride (TiSiN) formation steps according to alternate embodiments described herein.

In one embodiment, the purge step may be performed after the titanium nitride (TiN) layer deposition and prior to exposure to the silicon-containing gas. Referring to FIG. 5A, a titanium silicide nitride (TiSiN) fabrication sequence 500 includes providing a substrate to the process chamber (step 502), exposing the substrate to a silicon-containing gas (step 504), forming a titanium nitride (TiN) layer on the substrate (step 506), purging the process chamber to remove any reaction by-products generated during the titanium nitride (TiN) layer formation (step 508), exposing the titanium nitride (TiN) layer to a silicon containing-gas to form a titanium silicide nitride (TiSiN) layer (step 510) and plasma treating the titanium silicide nitride (TiSiN) layer with a hydrogen-containing plasma (step 512).

Figure 5B:
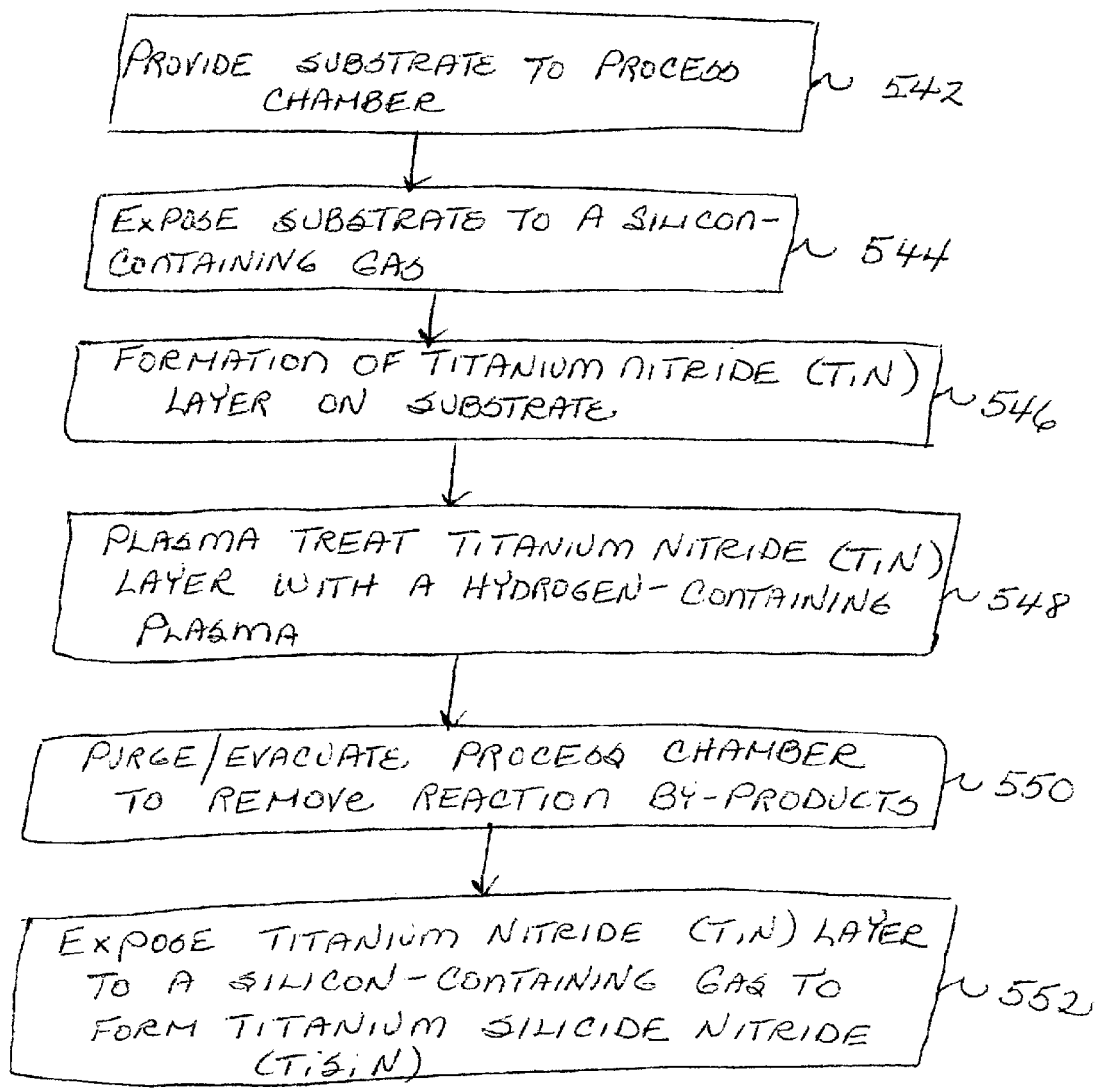

Alternatively, the purge step may be performed after the titanium nitride (TiN) layer is plasma treated with the hydrogen-containing gas and prior to exposure to the silicon-containing gas. Referring to FIG. 5B, a titanium silicide nitride (TiSiN) fabrication sequence 540 includes providing a substrate to the process chamber (step 542), exposing the substrate to a silicon-containing gas (step 544), forming a titanium nitride (TiN) layer on the substrate (step 546), plasma treating the titanium nitride (TiN) layer with a hydrogen-containing plasma (548), purging the process chamber to remove any reaction by-products generated during titanium nitride (TiN) layer formation and/or the plasma treatment thereof (step 550) and exposing the plasma treated titanium nitride (TiN) to a silicon-containing gas to form a titanium silicide nitride (TiSiN) layer (step 552).

Figure 5C:
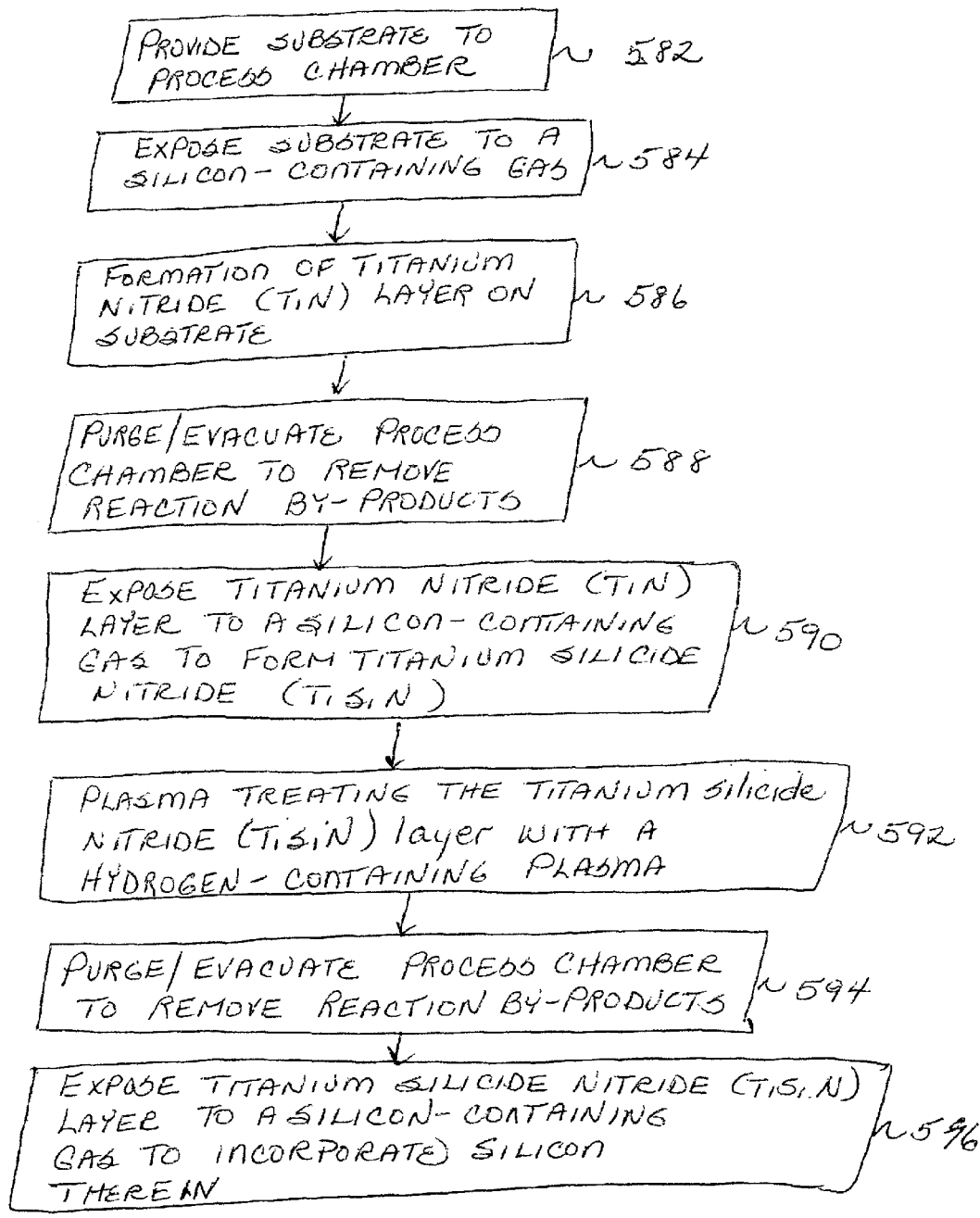

In another embodiment, more than one purge step may be performed. Referring to FIG. 5C, a first purge step may be performed after titanium nitride (TiN) layer deposition and a second purge step may be performed after the plasma treatment step using the hydrogen-containing plasma. For such an embodiment, a titanium silicide nitride (TiSiN) layer fabrication sequence 580 includes providing a substrate to the process chamber (step 582), exposing the substrate to a silicon-containing gas (step 584), forming a titanium nitride (TiN) layer on the substrate (step 586), purging the process chamber to remove any reaction by-products generated during titanium nitride (TiN) layer formation (step 588), exposing the titanium nitride (TiN) layer to a silicon-containing gas to form a titanium silicide nitride (TiSiN) layer (step 590), plasma treating the titanium silicide nitride (TiSiN) layer with a hydrogen-containing plasma (step 592), purging the process chamber to remove any reaction by-products generated during plasma treatment (step 594) and exposing the plasma treated titanium silicide nitride (TiSiN) layer to a silicon-containing gas to incorporate silicon therein (step 596).

Figure 6A:
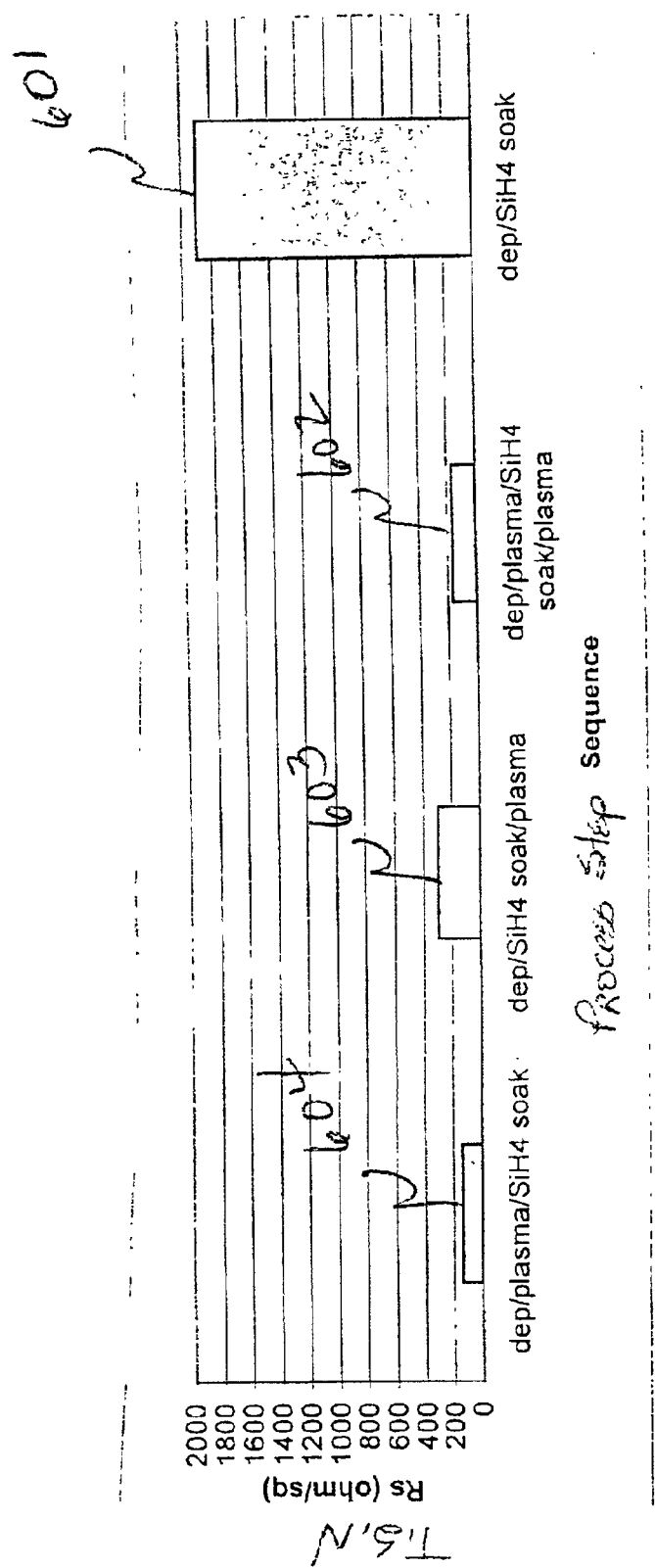
FIGS. 6A–6D are graphs of TiSiN layer resistivity ($R_S$) plotted as a function of the process step sequence, $SiH_4$ soak time and plasma treatment time.

The resistivity ($R_s$) for the titanium silicide nitride (TiSiN) layer may be variable depending on the sequence of process steps used during layer formation. FIG. 6A is a graph of titanium silicide nitride (TiSiN) resistivity plotted as a function of the sequence of process steps used during layer formation. For example, a titanium silicide nitride (TiSiN) formed using a process sequence comprising titanium nitride deposition/plasma treatment/ SiH$_4$ soak (denoted as 604 in FIG. 6A) have a lower resistivity than titanium silicide nitride (TiSiN) layers formed using process sequences comprising titanium nitride deposition/SiH$_4$ soak/ plasma treatment (denoted as 603 in FIG. 6A) or titanium nitride deposition/SiH$_4$ soak (denoted as 601 in FIG. 6A).

Figure 6B:
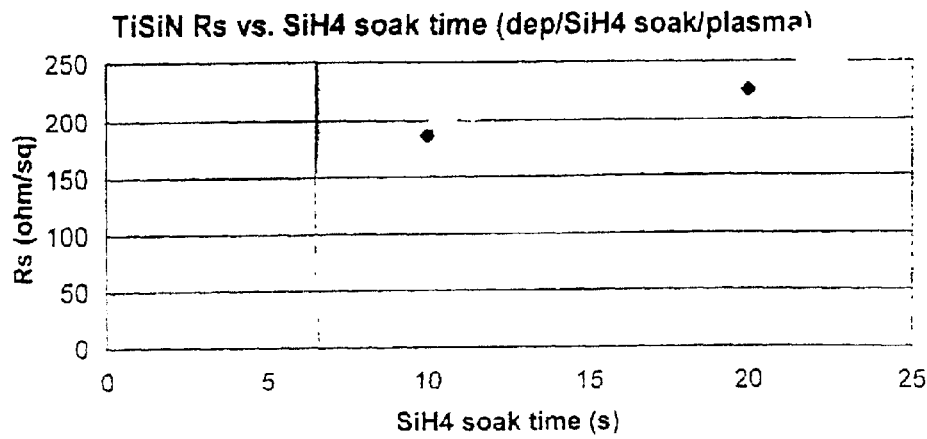

The resistivity ($R_S$) for the titanium silicide nitride (TiSiN) layer may also be variable depending on the soak time for the silicon-containing gas. FIG. 6B is a graph of titanium silicide nitride (TiSiN) resistivity plotted as a function of the soak time for silane ($SiH_4$). For example, the resistivity of a titanium silicide nitride (TiSiN) layer having a $SiH_4$ soak time of 10 seconds is lower than a titanium silicide nitride (TiSiN) layer having a $SiH_4$ soak time of 20 seconds.

Figure 6C:
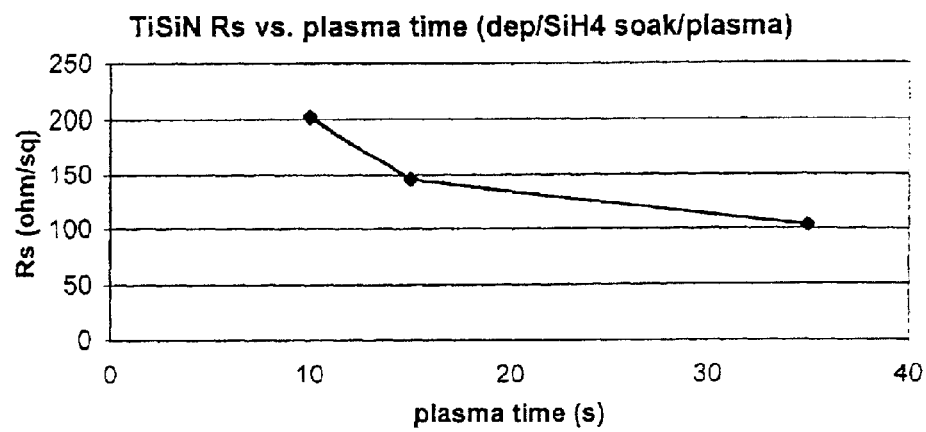
Figure 6D:
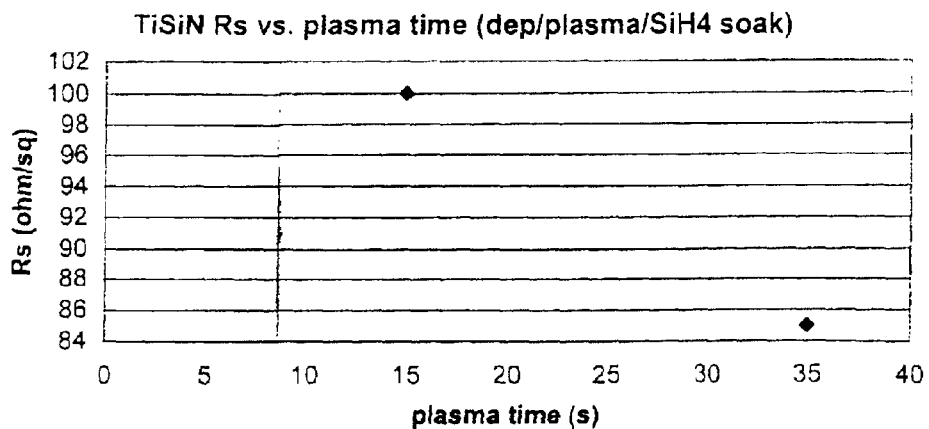

The resistivity ($R_S$) for the titanium silicide nitride (TiSiN) layer may also be variable depending on the plasma treatment time. FIG. 6C is a graph of titanium silicide nitride (TiSiN) resistivity plotted as a function of the plasma treatment time. The titanium silicide nitride (TiSiN) was formed using a titanium nitride/$SiH_4$ soak/plasma treatment process sequence. For example, referring to FIG. 6C, the resistivity of a titanium silicide nitride (TiSiN) layer having a plasma treatment time of 10 seconds is two times higher than a titanium silicide nitride (TiSiN) layer having a plasma treatment time of 35 seconds. Referring to FIG. 6D, a titanium silicide nitride (TiSiN) formed using a titanium nitride/plasma treatment/$SiH_4$ soak process sequence has a lower resistivity when a plasma treatment time of 35 seconds is used as opposed to a plasma treatment time of 35 seconds.

Integrated Circuit Fabrication Process

Figure 7A:
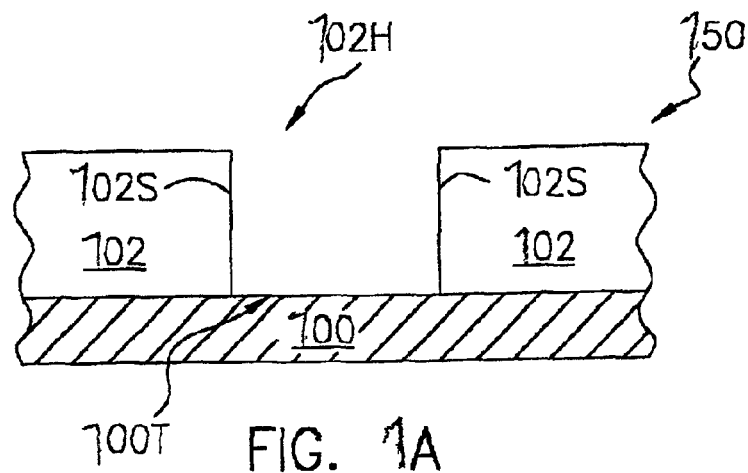
FIGS. 7A–7D depict schematic cross-sectional views of a substrate structure at different stages of an integrated circuit fabrication sequence incorporating a titanium silicide nitride (TiSiN) layer formed according to an embodiment described herein.

FIGS. 7A–7D illustrate schematic cross-sectional views of a substrate 700 at different stages of a tungsten plug fabrication sequence incorporating a titanium silicide nitride (TiSiN) layer formed according to an embodiment described herein. In general, the substrate 700 refers to any workpiece upon which film processing is performed, and a substrate structure 750 is used to generally denote the substrate 600 as well as other material layers formed on the substrate 700. Depending on the specific stage of processing, the substrate 700 may be a silicon semiconductor wafer, or other material layer, which has been formed thereon. FIG. 7A, for example, shows a cross sectional view of a substrate structure 750, having a material layer 702 thereon. In this particular illustration, the material layer 702 may be an oxide (e.g., silicon dioxide ($SiO_2$)). The material layer has been conventionally formed and patterned to provide a contact hole 702H extending to the top surface 700T of the substrate 700.

Figure 7B:
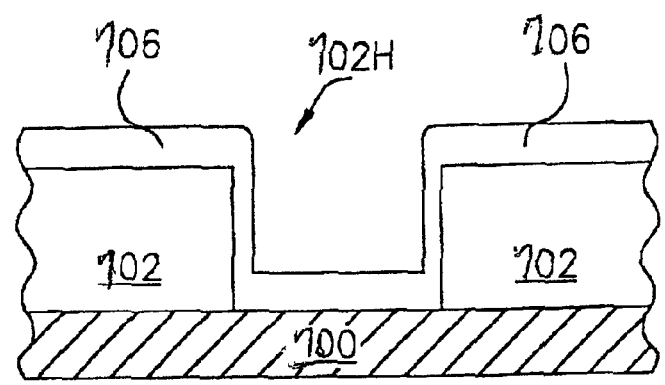

A titanium nitride (TiN) layer 706 is deposited in the contact hole 702H, as illustrated in FIG. 7B. The substrate 700 is treated with the silicon-containing gas and then the titanium nitride layer 706 was formed thereon according to the process parameters described above with respect to step 304 and step 306 of FIG. 3, respectively. The thickness of the titanium nitride (TiN) layer 706 is variable depending on the specific stage of processing. Typically, the titanium nitride (TiN) layer 706 has a thickness of about 20 Å to about 500 Å.

Figure 7C:
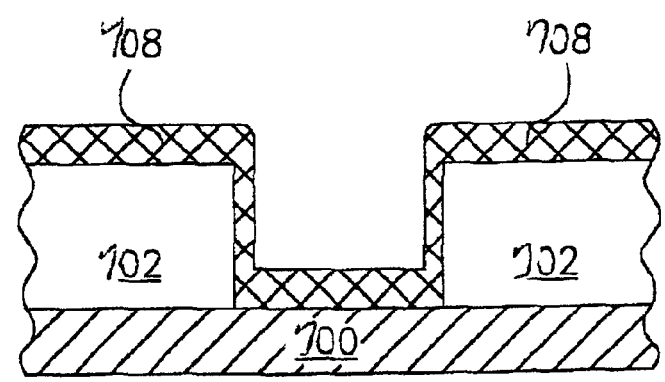

After the titanium nitride layer 706 is formed, such layer is exposed to a silicon-containing gas to convert it to a titanium silicide nitride (TiSiN) layer 708 as described above with reference to step 308 (FIG. 3) and illustrated in FIG. 7C. Thereafter, the titanium silicide nitride (TiSiN) layer 708 is treated with the hydrogen-containing plasma, as described above with respect to step 310 of FIG. 3.

Figure 7D:
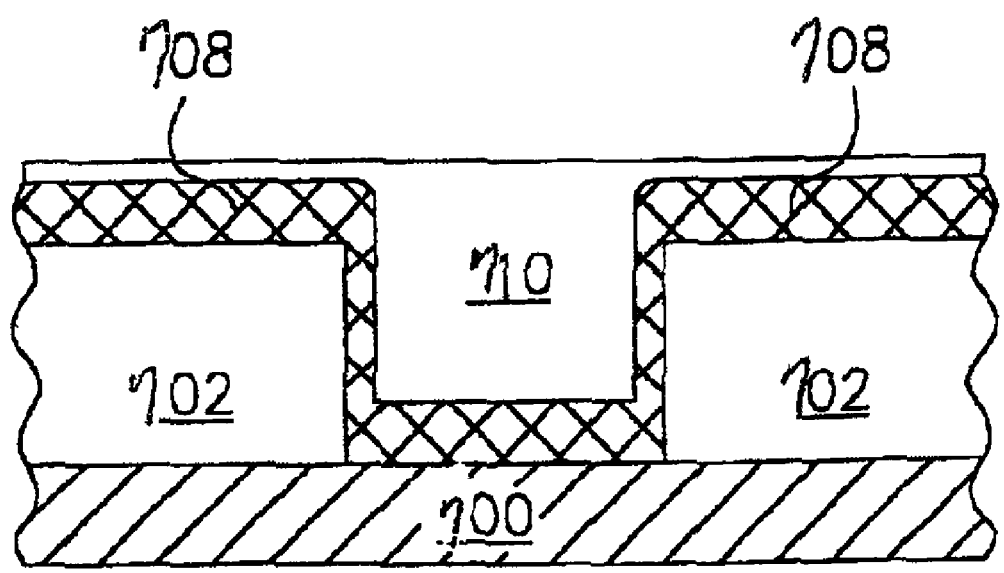

Referring to FIG. 7D, the tungsten plug fabrication sequence is completed by filling the contact holes 702H with tungsten (W) 710. The tungsten (W) may be deposited on the titanium silicide nitride (TiSiN) layer 708, for example, by reacting tungsten hexafluoride ($WF_6$) and hydrogen ($H_2$). Adhesion of the tungsten (W) 710 is improved by the presence of the titanium silicide nitride (TiSiN) layer 708, formed using the embodiments described herein.

While foregoing is directed to the preferred embodiment of the present invention, other and further embodiments of the invention may be devised without departing from the basic scope thereof, and the scope thereof is determined by the claims that follow.

What is claimed is:

1. A method of film deposition, comprising:
   (a) treating a first surface of a substrate in a process chamber with a silicon-containing gas;
   (b) forming a titanium nitride (TiN) layer on the first surface of the substrate after performing step (a); and
   (c) exposing the titanium nitride (TiN) layer to a silicon-containing gas to convert the titanium nitride (TiN) layer to a titanium silicide nitride (TiSiN) layer.

2. The method of claim 1 wherein the silicon-containing gas of step (a) and step (C) is selected from the group consisting of silane ($SiH_4$) and disilane ($Si_2H_6$).

3. The method of claim 2 wherein the silicon-containing gas is mixed with one or more gases selected from the group consisting of hydrogen ($H_2$), nitrogen ($N_2$), argon (Ar) and helium (He).

4. The method of claim 3 wherein the silicon-containing gas is mixed with hydrogen ($H_2$).

5. The method of claim 4 wherein the ratio of the silicon-containing gas to the hydrogen ($H_2$) is greater than 1.

6. The method of claim 1 wherein the titanium nitride (TiN) layer is formed from a reaction of titanium tetrachloride ($TiCl_4$) and ammonia ($NH_3$).

7. The method of claim 1, further comprising treating the titanium nitride layer with a hydrogen-containing plasma prior to exposing the titanium nitride (TIN) layer to the silicon-containing gas of step (c).

8. The method of claim 1, further comprising:
   (d) treating the titanium silicide nitride (TiSiN) layer with a hydrogen-containing plasma.

9. The method of claim 1, further comprising removing reaction by-products generated during titanium nitride (TiN) layer formation from the process chamber prior to exposing the titanium nitride (TiN) layer to the silicon-containing gas of step (c).

10. The method of claim 9 wherein the reaction by-products are removed from the process chamber by providing a purge gas thereto and evacuating both the purge gas and the reaction by-products therefrom.

11. The method of claim 10 wherein the purge gas comprises one or more gases selected from the group consisting of nitrogen ($N_2$), hydrogen ($H_2$), helium (He), argon (Ar), neon (Ne) and xenon (Xe).

12. A method of film deposition, comprising:
   (a) treating a first surface of a substrate in a process chamber with a silicon-containing gas;
   (b) forming a titanium nitride (TiN) layer on the first surface of the substrate after performing step (a);
   (c) exposing the titanium nitride (TiN) layer to a silicon-containing gas to convert the titanium nitride (TIN) layer to a titanium silicide nitride (TiSiN) layer;
   (d) treating the titanium silicide nitride (TiSiN) layer with a hydrogen-containing plasma; and
   (e) exposing the titanium silicide nitride (TiSiN) layer to a silicon-containing gas to incorporate silicon therein.

13. The method of claim 12 wherein the silicon-containing gas of step (a), step (c) and step (e) is selected from the group consisting of silane ($SiH_4$) and disilane ($Si_2H_6$).

14. The method of claim 13 wherein the silicon-containing gas is mixed with one or more gases selected from the group consisting of hydrogen ($H_2$), nitrogen ($N_2$), argon (Ar) and helium (He).

15. The method of claim 14 wherein the silicon-containing gas is mixed with hydrogen ($H_2$).

16. The method of claim 15 wherein the ratio of the silicon-containing gas to the hydrogen ($H_2$) is greater than 1.

17. The method of claim 12 wherein the titanium nitride (TiN) layer is formed from a reaction of titanium tetrachloride ($TiCl_4$) and ammonia ($NH_3$).

18. The method of claim 12, further comprising removing reaction by-products from the process chamber prior to exposing the titanium nitride (TiN) layer to the silicon-containing gas in step (c) and step (e).

19. The method of claim 18 wherein the reaction by-products are removed from the process chamber by providing a purge gas thereto and evacuating both the purge gas and the reaction by-products therefrom.

20. The method of claim 19 wherein the purge gas comprises one or more gases selected from the group consisting of nitrogen ($N_2$), hydrogen ($H_2$), helium (He), argon (Ar), neon (Ne) and xenon (Xe).

21. A method of forming a barrier layer for use in integrated circuit fabrication, comprising:
    (a) treating a first surface of a substrate in a process chamber with a silicon-containing gas;
    (b) forming a titanium nitride (TiN) layer on the first surface of the substrate after performing step (a);
    (c) exposing the titanium nitride (TiN) layer to a silicon-containing gas to convert the titanium nitride (TiN) layer to a titanium silicide nitride (TiSiN) layer; and
    (d) forming a metal layer on the titanium silicide nitride (TiSiN) layer.

22. The method of claim 21 wherein the silicon-containing gas of step (a) and step (c) is selected from the group consisting of silane ($SiH_4$) and disilane ($Si_2H_6$).

23. The method of claim 22 wherein the silicon-containing gas is mixed with one or more gases selected from the group consisting of hydrogen ($H_2$), nitrogen ($N_2$), argon (Ar) and helium (He).

24. The method of claim 23 wherein the silicon-containing gas is mixed with hydrogen ($H_2$).

25. The method of claim 24 wherein the ratio of the silicon-containing gas to the hydrogen ($H_2$) is greater than 1.

26. The method of claim 21 wherein the titanium nitride (TiN) layer is formed from a reaction of titanium tetrachloride ($TiCl_4$) and ammonia ($NH_3$).

27. The method of claim 21, further comprising treating the titanium nitride layer with a hydrogen-containing plasma prior to exposing the titanium nitride (TiN) layer to the silicon-containing gas of step (c).

28. The method of claim 21, further comprising:
    (e) treating the titanium silicide nitride (TiSiN) layer with a hydrogen-containing plasma.

29. The method of claim 21, further comprising removing reaction by-products generated during titanium nitride (TiN) layer formation from the process chamber prior to exposing the titanium nitride (TiN) layer to the silicon-containing gas of step (c).

30. The method of claim 29 wherein the reaction by-products are removed from the process chamber by providing a purge gas thereto and evacuating both the purge gas and the reaction by-products therefrom.

31. The method of claim 30 wherein the purge gas comprises one or more gases selected from the group consisting of nitrogen ($N_2$), hydrogen ($H_2$), helium (He), argon (Ar), neon (Ne) and xenon (Xe).

32. A method of forming a barrier layer for use in integrated circuit fabrication, comprising:
    (a) treating a first surface of a substrate in a process chamber with a silicon-containing gas;
    (b) forming a titanium nitride (TiN) layer on the first surface of the substrate after performing step (a);
    (c) exposing the titanium nitride (TiN) layer to a silicon-containing gas to convert the titanium nitride (TiN) layer to a titanium silicide nitride (TiSiN) layer;
    (d) treating the titanium silicide nitride (TiSiN) layer with a hydrogen-containing plasma;
    (e) exposing the titanium silicide nitride (TiSiN) layer to a silicon-containing gas to incorporate silicon therein; and
    (f) forming a metal layer on the titanium silicide nitride (TiSiN) layer.

33. The method of claim 32 wherein the silicon-containing gas of step (a), step (c) and step (e) is selected from the group consisting of silane ($SiH_4$) and disilane ($Si_2H_6$).

34. The method of claim 33 wherein the silicon-containing gas is mixed with one or more gases selected from the group consisting of hydrogen ($H_2$), nitrogen ($N_2$), argon (Ar) and helium (He).

35. The method of claim 34 wherein the silicon-containing gas is mixed with hydrogen ($H_2$).

36. The method of claim 35 wherein the ratio of the silicon-containing gas to the hydrogen ($H_2$) is greater than 1.

37. The method of claim 32 wherein the titanium nitride (TiN) layer is formed from a reaction of titanium tetrachloride ($TiCl_4$) and ammonia ($NH_3$).

38. The method of claim 32, further comprising removing reaction by-products from the process chamber prior to exposing the titanium nitride (TiN) layer to the silicon-containing gas in step (c) and step (e).

39. The method of claim 38 wherein the reaction by-products are removed from the process chamber by providing a purge gas thereto and evacuating both the purge gas and the reaction by-products therefrom.

40. The method of claim 39 wherein the purge gas comprises one or more gases selected from the group consisting of nitrogen ($N_2$), hydrogen ($H_2$), helium (He), argon (Ar), neon (Ne) and xenon (Xe).

* * * * *

UNITED STATES PATENT AND TRADEMARK OFFICE
CERTIFICATE OF CORRECTION

PATENT NO. : 6,933,021 B2
DATED : August 23, 2005
INVENTOR(S) : Jing-Pei Chou et al.

It is certified that error appears in the above-identified patent and that said Letters Patent is hereby corrected as shown below:

Column 4,
Line 5, delete "suicide" and insert -- silicide --;

Column 10,
Line 17, delete "(C)" and insert -- (c) --;
Lines 31 and 56, delete "(TIN)" and insert -- (TiN) --.

Signed and Sealed this

Twenty-fourth Day of January, 2006

JON W. DUDAS
*Director of the United States Patent and Trademark Office*